United States Patent
Matsuda

(10) Patent No.: US 6,909,083 B2
(45) Date of Patent: Jun. 21, 2005

(54) PHOTODETECTOR AND UNIT MOUNTED WITH PHOTODETECTOR

(75) Inventor: Kenichi Matsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 192 days.

(21) Appl. No.: 10/357,343

(22) Filed: Feb. 4, 2003

(65) Prior Publication Data

US 2003/0136896 A1 Jul. 24, 2003

Related U.S. Application Data

(62) Division of application No. 10/094,643, filed on Mar. 12, 2002, now Pat. No. 6,525,347.

(30) Foreign Application Priority Data

Mar. 12, 2001 (JP) ........................................ 2001-068963

(51) Int. Cl.[7] .............................................. H01L 31/00
(52) U.S. Cl. ..................... 250/214.1; 257/461; 257/184; 257/431
(58) Field of Search ................................. 257/461, 184, 257/431–438; 250/214.1

(56) References Cited

U.S. PATENT DOCUMENTS

| 4,442,444 A | 4/1984 | Osaka |
| 5,569,942 A | 10/1996 | Kusakabe |
| 6,043,550 A | 3/2000 | Kuhara et al. |
| 6,104,047 A | 8/2000 | Watanabe |
| 6,396,117 B1 | 5/2002 | Furukawa et al. |
| 6,617,568 B1 * | 9/2003 | Matsuda .................. 250/214.1 |
| 2002/0050622 A1 | 5/2002 | Takeuchi |
| 2002/0110950 A1 | 8/2002 | Matsuda |

FOREIGN PATENT DOCUMENTS

| JP | 60-079781 A | 5/1985 |
| JP | 60 130870 A | 7/1985 |
| JP | 01-238070 | 9/1989 |
| JP | 2000-36615 | 2/2000 |

* cited by examiner

Primary Examiner—Thanh X. Luu
(74) Attorney, Agent, or Firm—Nixon Peabody LLP

(57) ABSTRACT

A filter layer and a buffer layer are sequentially laminated on a first principal face of a semiconductor substrate, and an island-shaped light absorption layer and a window layer are laminated on top of the buffer layer. A diffusion region in which p-type impurities have been diffused is formed in the window layer. An n-side electrode and a p-side electrode are formed on the buffer layer and the diffusion region, respectively. A light incidence portion is formed on the buffer layer where the light absorption layer has not been formed.

2 Claims, 9 Drawing Sheets

FIG. 7A
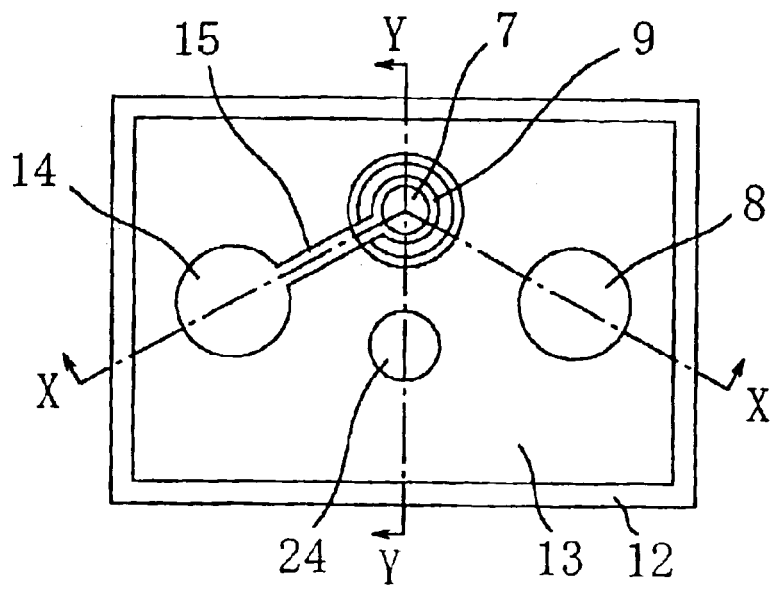
FIG. 7B
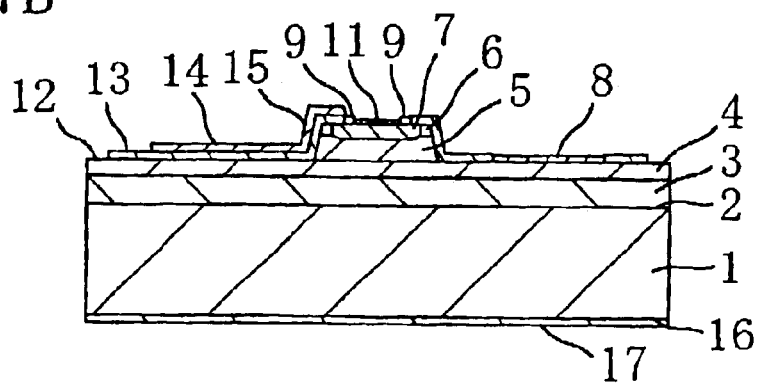
FIG. 7C
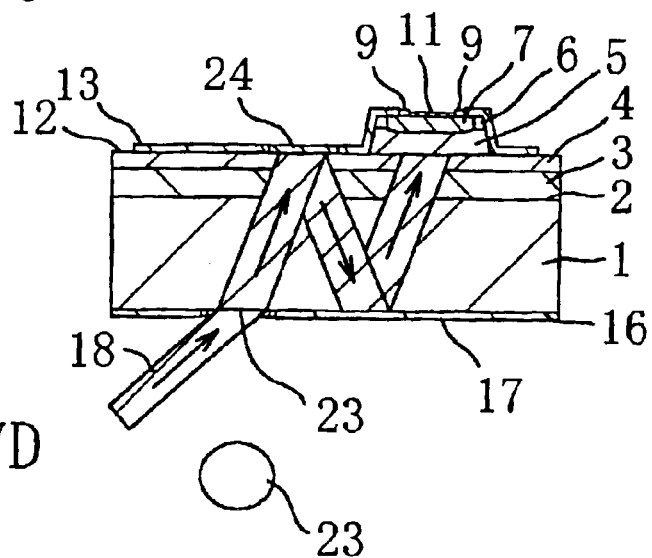
FIG. 7D

PHOTODETECTOR AND UNIT MOUNTED WITH PHOTODETECTOR

BACKGROUND OF THE INVENTION

The present invention relates to a photodetector and a unit mounted with a photodetector, and in particular relates to a photodetector that selectively receives signal light of a long wavelength (on the long wavelength side) when there is a plurality of incident signal lights of different wavelengths.

Currently there are broad applications for PIN photodiodes of a compound semiconductor material as photodetectors for optical fiber communications.

These PIN photodiodes employ a window structure to increase light-receiving sensitivity. In these PIN photodiodes, a light absorbing layer with a small forbidden bandwidth (long absorption edge wavelength) is formed on a semiconductor substrate, and a filter layer (window layer) with a large forbidden bandwidth (short absorption edge wavelength) is formed thereon. This structure makes it possible for light of the absorption edge wavelengths of the light absorption layer and the filter layer to be efficiently received.

A typical PIN photodiode is made of InGaAs/InP, where InGaAs is the material for the light absorption layer and InP is the material for the filter layer. In this case, the signal light in the wavelength range of 0.9 $\mu$m to 1.65 $\mu$m, which are the absorption edge wavelengths of InP and InGaAs, respectively, can be received with high sensitivity. An example of such a PIN photodiode structure is disclosed in Japanese Laid-Open Patent Publication No. 1-238070.

Hereinafter, a conventional PIN photodiode will be described with reference to FIG. 10. FIG. 10 is a cross-sectional view of a conventional PIN photodiode.

As shown in FIG. 10, an n$^-$-InP carrier blocking layer (buffer layer) 102, an n$^-$-InGaAs light absorption layer 103, an n$^-$-AlAsSb carrier blocking layer 104, and an n$^-$-InP filter layer 105 are sequentially laminated onto an n$^+$-InP substrate 101. Here, the forbidden bandwidth of the AlAsSb is larger than that of the InP, and has an absorption edge wavelength of 0.67 $\mu$m.

A p$^+$ diffusion region 106 made by the diffusion of Zn is formed in the filter layer 105 and the carrier blocking layer 104, and a surface protection film 107 is formed thereon. Additionally, a ringed anode electrode 108 is formed on the diffusion region 106, and a cathode electrode 109 is formed on the back face of the substrate 101.

It should be noted that since the PIN photodiode shown in FIG. 10 includes the carrier blocking layer 104, it has an improved sensitivity with respect to signal light of wavelengths of 0.9 $\mu$m or less over a PIN photodiode in which the carrier blocking layer 104 is not formed.

To explain the reason for this, signal light of wavelengths of 0.9 $\mu$m or less are absorbed by the filter layer 105 and generate electron-hole pairs, and in the case of PIN photodiodes in which the carrier blocking layer 104 is not formed, some of the electrons generated in the filter layer 105 flow into the light absorption layer 103 to become photoelectric current. In contrast, when there is the carrier blocking layer 104, the electrons are blocked by the hetero barrier at the interface between the filter layer 105 and the carrier blocking layer 104, and therefore do not become photoelectric current.

Passband type PIN photodiodes that are sensitive only to light of a narrower wavelength range have also been developed. For example, when performing wavelength multiplex communication with signal light of a 1.3 $\mu$m wavelength and signal light of a 1.55 $\mu$m wavelength, a passband type PIN photodiode sensitive only to those wavelengths is useful.

Here a PIN photodiode with short wavelength passband properties that is adequately sensitive to signal light of a 1.3 $\mu$m wavelength but has almost no sensitivity to signal light of a 1.55 $\mu$m wavelength can be readily achieved by forming the light absorption layer of the above PIN photodiode made of InGaAs, using an InGaAsP with an absorption edge wavelength of 1.4 $\mu$m.

On the other hand, long wavelength passband properties where there is sufficient sensitivity to signal light of a 1.55 $\mu$m wavelength but almost no sensitivity to 1.3 $\mu$m wavelength signal light can be attained by taking InP as the material for the carrier blocking layer 104 and InGaAsP with an absorption edge wavelength of 1.4 $\mu$m as the material for the filter layer 105. The relationship of the forbidden bandwidth of the carrier blocking layer 104 being larger than that of the filter layer 105 is maintained.

However, in conventional PIN photodiodes having passband properties, the filter layer 105 had to be made thick to increase the sensitivity difference with respect to long wavelength side signal light and short wavelength side signal light.

Accordingly, to achieve a PIN photodiode with long wavelength passband properties the material for the filter layer 105 should be InGaAsP, as described above. However, there is the problem that epitaxially growing a thick InGaAsP easily causes fluctuations in the composition of the InGaAsP.

On the other hand, in a planar PIN photodiode, in which impurities such as Zn are diffused in an island in the filter layer 105 to form a diffusion region, the thickness of the carrier blocking layer 104 is 1 to 2 $\mu$m, and typically the diffusion of impurities is carried out to this depth.

This means that in conventional PIN photodiodes, even taking InGaAsP as the material for the filter layer 105 and being able to epitaxially grow the filter layer 105 thickly leaves the problem that it is difficult to diffuse impurities deeply and with good control. It should be noted that if the photodiode is a mesa PIN photodiode, in which the carrier blocking layer 104 and the filter layer 105 are doped so as to be p-type in advance and the element is separated by etching, it is no longer necessary to partially diffuse the impurities in an island-shape, but mesa PIN photodiodes, particularly those that are InGaAs/InP, have a large dark current and are less reliable than planar PIN photodiodes fabricated by impurity diffusion.

SUMMARY OF THE INVENTION

It is a main object of the present invention to provide a photodetector with long wavelength passband properties in which a high sensitivity ratio is obtained even with a thin filter layer and the depth of impurity diffusion in the light-receiving portion is equivalent to that of conventional PIN photodiodes.

A first photodetector according to the present invention includes a semiconductor substrate, a filter layer formed on a first principal face of the semiconductor substrate, a light absorption layer formed in an island on the filter layer, and a light incidence portion formed on the filter layer at a portion where the light absorption layer has not been formed; wherein the absorption edge wavelength of the filter layer is longer than the absorption edge wavelength of the semiconductor substrate and shorter than the absorption edge wavelength of the light absorption layer.

With the first photodetector, incident light that enters obliquely from the light incidence portion formed on the first principal face side of the semiconductor substrate is reflected at the second principal face so that the light passes through the filter layer, which is formed between the semiconductor substrate and the light absorption layer, twice before it is incident to the light absorption layer. This means that compared to photodetector with a structure in which the incident light passes through the filter layer a single time, the thickness of the filter layer can be made substantially double.

Additionally, it is preferable that in the first photodetector, a reflective film is formed on a second principal face of the semiconductor substrate.

Further, it is preferable that the first photodetector includes a carrier blocking layer formed between the filter layer and the light absorption layer, and of a material with a larger forbidden bandwidth than that of the filter layer; and a wide band gap layer formed on the light absorption layer and having an impurity diffusion region.

With this structure, the filter layer is between the light absorption layer and the semiconductor substrate, and thus a planar type PIN photodiode can be easily made by laminating a wide band gap layer on top of the light absorption layer to form a light-receiving portion by the diffusion of impurities. Moreover, the thickness of the filter layer can be made substantially double, so that the depth of impurity diffusion can be made equivalent to that of conventional PIN photodiodes. Furthermore, if a carrier blocking layer of a material with a larger forbidden bandwidth than that of the filter layer is interposed between the filter layer and the light absorption layer, then carriers generated at the filter layer can be prevented from flowing into the light absorption layer.

It is preferable that in the first photodetector, the semiconductor substrate, the filter layer, and the carrier blocking layer are of a first conduction type and the impurity diffusion region is of a second conduction type; and that the first photodetector includes a first electrode formed on at least one of the semiconductor substrate, the filter layer, and the carrier blocking layer; a second electrode formed on the impurity diffusion region; a pad portion formed on at least one of the semiconductor substrate, the filter layer, and the carrier blocking layer via an insulating film; and wiring for electrically connecting the second electrode and the pad portion.

With this structure, the p-side electrode and the n-side electrode can both be formed on the first principal face side of the semiconductor substrate, and flip-chip bonding can be easily performed. Also, by forming the pad for bonding the p-side electrode to the mounting substrate outside the island-shaped light absorption layer, the size difference between the light absorption layer mesa and the diffusion region can be reduced, so that tail current caused by incident light entering the light absorption layer aside from the portion thereof below the diffusion layer can be suppressed.

A second photodetector according to the present invention is characterized by further including in the first photodetector a sloped portion formed on a second principal face of the semiconductor substrate for reflecting incident light that has entered the semiconductor substrate and letting it incident to the light absorption layer.

With this structure, the incident light that is perpendicularly incident to the first principal face can be reflected by the sloped portion, so that even if the incident light is made perpendicularly incident, it can still be made incident to the light absorption portion.

A third photodetector according to the present invention includes a semiconductor substrate, a filter layer formed on a second principal face of the semiconductor substrate, a light absorption layer formed in an island on a first principal face of the semiconductor substrate, and a light incidence portion formed on the first principal face at a portion where the light absorption layer has not been formed; wherein an absorption edge wavelength of the filter layer is longer than an absorption edge wavelength of the semiconductor substrate and shorter than an absorption edge wavelength of the light absorption layer.

With this structure, like with the first photodetector, incident light that enters obliquely from the light incidence portion formed on the first principal face side of the, semiconductor substrate is reflected at the second principal face so that the light passes through the filter layer, which is formed between the semiconductor substrate and the light absorption layer, twice before it is incident to the light absorption layer. This means that compared to a photodetector with a structure where the incident light passes through the filter layer a single time, the thickness of the filter layer can be made substantially double.

Further, it is preferable that the third photodetector include a wide band gap layer formed on the light absorption layer and having an impurity diffusion region.

In a fourth photodetector according to the present invention, the third photodetector further includes a sloped portion in the first principal face of the semiconductor substrate, wherein the light incidence portion is in the sloped portion.

With this structure, incident light that enters the first principal face perpendicularly can be refracted by the sloped portion, so that even perpendicularly incident light can be made incident to the light absorption layer.

Furthermore, it is preferable that in the first through fourth photodetectors, the light incident from the light incidence potion passes through the filter layer at least twice before it is incident to the light absorption layer.

A fifth photodetector according to the present invention includes a semiconductor substrate, a filter layer formed on a first principal face side or a second principal face side of the semiconductor substrate, a light absorption layer formed in an island on the first principal face side of the semiconductor substrate, a reflective film formed on the first principal face side of the semiconductor substrate, and a light incidence portion formed on the second principal face side of the semiconductor substrate; wherein the absorption edge wavelength of the filter layer is longer than an absorption edge wavelength of the semiconductor substrate and shorter than the absorption edge wavelength of the light absorption layer.

With this structure, the incident light enters from the light incidence portion formed on the second principal face side of the semiconductor substrate, but unlike typical rear-incidence type PIN photodiodes, where it is then incident to light absorption layer on the first principal face side, in this case it is reflected by the reflective film formed on the first principal face side and can be made incident to the light absorption layer after it has been reflected by the second principal face. In this case, the incident light passes through the filter layer three times, so that the thickness of the filter layer through which the incident light passes can be substantially tripled.

Further, it is preferable that in the fifth photodetector, the light incident from the light incidence portion passes through the filter layer at least three times before it is incident to the light absorption layer.

In a sixth photodetector according to the present invention, the filter layer and the carrier blocking layer are formed in a single or a plurality of islands, the semiconductor substrate is semi-insulating, the filter layer and the carrier blocking layer are of a first conduction type, and the impurity diffusion region is of a second conduction type; wherein the photodetector includes a first electrode formed on either the filter layer or the carrier blocking layer in the island having the light absorption layer, a second electrode formed on the impurity diffusion region, a pad portion formed on the semiconductor substrate, or on the filter layer or carrier blocking layer forming an island other than the island on which the first electrode has been formed, and wiring for electrically connecting the second electrode and the pad portion.

With this structure, by using a semi-insulating semiconductor substrate, the pad capacitance of the p-side electrode can be prevented from being added to the element capacitance.

A unit mounted with a photodetector according to the present invention has a mounting substrate, an optical wave guide formed within the mounting substrate, a polarizing element for polarizing the route of incident light propagating the optical wave guide to the surface direction of the mounting substrate, and a photodetector set to the mounting substrate; wherein the photodetector includes a semiconductor substrate, a filter layer formed on at least one of a first principal face side and a second principal face side of the semiconductor substrate, a light absorption layer formed in an island on the first principal face side of the semiconductor substrate, and a light incidence portion formed on the first principal face side of the semiconductor substrate; wherein the photodetector is set in such a way that the first principal face side on which the light incidence portion has been formed is directed toward the mounting substrate.

With this structure, the photodetector can be easily optically bonded from the mounting substrate side by flip-chip bonding, so that compared to the case where it is wire-bonded, there is a reduction in parasitic capacitance accompanying mounting and high operational speeds can be achieved. Moreover, the optical bonding is also completed at the moment of bonding, so that a mounting process for optical bonding is unnecessary.

Additionally, it is preferable that in the unit mounted with a photodetector the optical wave guide is an optical fiber buried in a groove formed on the mounting substrate, the polarizing element is a reflective plate inserted into a slit formed on the mounting substrate such that it severs the optical fiber, and the photodetector is set to the mounting substrate such that it spans the groove.

According to the photodetector of the present invention, incident light that enters from the light incidence portion is reflected by the first or second principal face and passes through a filter layer formed between a semiconductor substrate and a light absorption layer at least twice before it is incident to the light absorption layer. Thus, compared to photodetectors with a structure in which incident light passes through the filter layer only once, the thickness of the filter layer can be made substantially at least double. The result is that a sensitivity ratio of 20 dB or more, for example, can be obtained for signal light of a long wavelength side (1.55 $\mu$m) and signal light of a short wavelength side (1.3 $\mu$m).

Moreover, according to the unit mounted with photodetector of the present invention, the photodetector can be easily flip-chip bonded to the mounting substrate, so that compared to the case where it is wire-bonded, there is a reduction in parasitic capacitance that accompanies the mounting, high operation speeds become possible, and furthermore the optical bonding is also completed at the moment of bonding, so that a mounting step for optical bonding is unnecessary.

BRIEF DESCRIPTION OF THE DRAWINGS

FIG. 7A is a plan view of a photodetector according to a fifth embodiment of the present invention.

FIG. 7B is a cross-sectional view taken along the X—X line in FIG. 7A.

FIG. 7C is a cross-sectional view taken along the Y—Y line in FIG. 7A.

FIG. 7D is a rear face view showing a portion of the photodetector of the fifth embodiment.

DESCRIPTION OF THE PREFERRED EMBODIMENTS

Figure 1A:
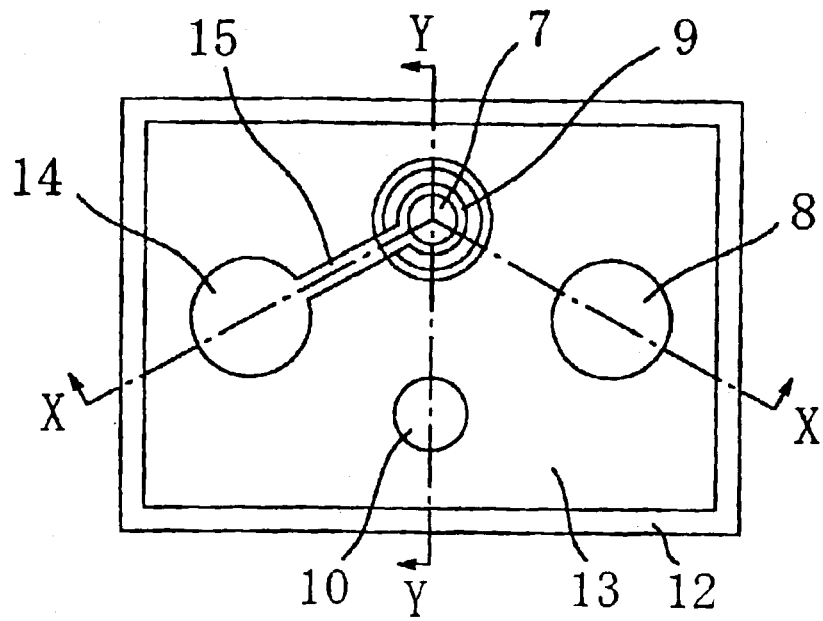
FIG. 1A is a plan view of a photodetector according to a first embodiment of the present invention.

Embodiments of the photodetector and the unit mounted with a photodetector of the present invention will be described with reference to the accompanying drawings. For the sake of simplifying the description, components with substantially the same functions are shown by the same reference numerals in the following drawings. It should be noted that the present invention is not limited to the following embodiments.

First Embodiment

Figure 1B:
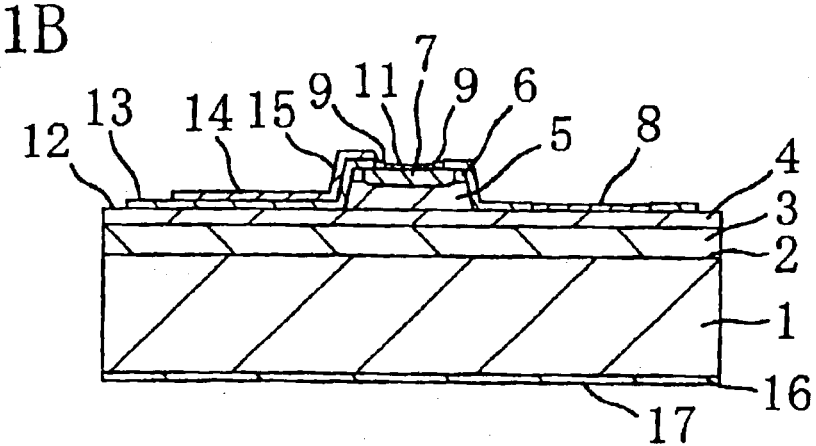
FIG. 1B is a cross-sectional view taken along the X—X line in FIG. 1A.
Figure 1C:
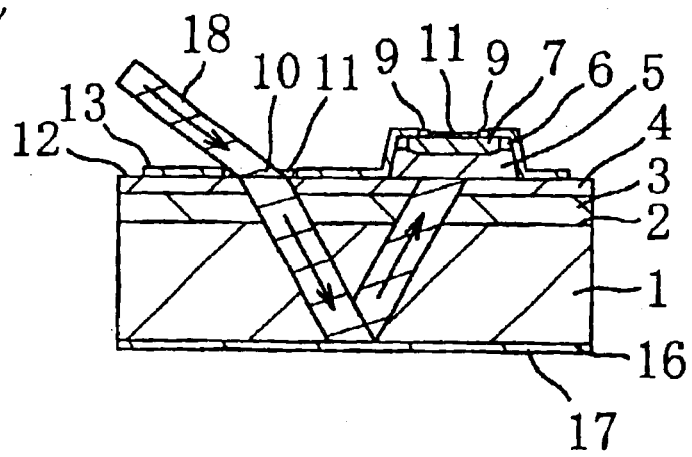
FIG. 1C is a cross-sectional view taken along the Y—Y line in FIG. 1A.

The photodetector according to a first embodiment of the present invention will be described with reference to FIG. 1. FIG. 1A is a plan view of the photodetector according to the first embodiment. FIG. 1B is a cross-sectional view taken along the X—X line in FIG. 1A. FIG. 1C is a cross-sectional view taken along the Y—Y line in FIG. 1A.

The photodetector of this embodiment includes a semiconductor substrate 1, a filter layer 3 formed on a first principal face 2 of the semiconductor substrate 1, and a light absorption layer 5 formed in an island on the filter layer 3. Here the absorption edge wavelength of the filter layer 3 is longer than the absorption edge wavelength of the semiconductor substrate 1 and shorter than the absorption edge wavelength of the light absorption layer 5. Further, a light incidence portion 10 is formed at a portion of the filter layer 3 where the light absorption layer 5 has not been formed. It is preferable that a carrier blocking layer (buffer layer) 4 made of a material with a larger forbidden bandwidth than that of the filter layer 3 is formed between the filter layer 3 and the light absorption layer 5.

The photodetector shown in FIG. 1 is a InGaAs/InP PIN photodiode, and as shown in FIG. 1B, in the structure of this embodiment, the filter layer 3 made of n-type InGaAsP of a 1.4 $\mu$m absorption edge wavelength, and the carrier blocking layer (buffer layer) 4 made of n-type InP are sequentially laminated on the first principal face 2 of the semiconductor substrate 1 made of n-type InP. Furthermore, the island-shaped light absorption layer 5 made of low concentration n-type InGaAs and a wide band gap layer (window layer) 6 made of low concentration n-type InP are laminated on the carrier blocking layer 4. Like the carrier blocking layer 4, the wide band gap layer 6 is made of a material with a larger forbidden bandwidth than that of the filter layer 3. A diffusion region 7 in which p-type impurities (such as Zn or Be) have been diffused is formed in the center area of the wide band gap layer 6. Also, a circular n-side electrode 8 and a ring shaped p-side electrode 9 are formed on the carrier blocking layer 4 and the diffusion region 7, respectively.

As shown in FIG. 1C, the circular light incidence portion 10 is formed on the carrier blocking layer 4 away from the light absorption layer 5. An antireflective film 11 made of SiN is deposited to the inner side of the light incidence portion 10 and the p-side electrode 9. The antireflective film 11 is also formed on the diffusion region 7.

As shown in FIGS. 1A and 1B, the exposed surface of the carrier blocking layer 4, aside for at a scribe lane 12 at the periphery of the photodetector, is covered with an insulating film 13 made by laminating SiN and $SiO_2$. A pad (pad electrode) 14, which is a conductor, is formed on the insulating film 13 and is electrically connected to the p-side electrode 9 via wiring 15. In the this embodiment, the pad 14 and the n-side electrode 8 are formed symmetrical with respect to the line connecting the center of the light incidence portion 10 and the light absorption layer 5. The n-side electrode 8, the p-side electrode 9, the pad 14, and the wiring 15 are made of laminated metal films of, for example, Ti/Pt/Au, and the patterns thereof can be formed collectively by a single vapor deposition and lift-off process.

A reflective film 17 for reflecting the incident light is formed on a second principal face 16 of the semiconductor substrate 1. The reflective film 17 can be configured by a metal film only, but an even higher reflectance can be attained if it is a laminated structure of a dielectric and a metal, for example, SiN and Al. This is because forming a metal film directly onto the semiconductor substrate 1 causes an alloying reaction between the two and leads to instances where a suitable reflective face is not formed. Of course, this problem can be avoided by using a metal that does not readily cause an alloying reaction, but many of the metals that do not readily react have poor adhesive properties, and therefore it preferable that the metal film is formed on the semiconductor substrate 1 via a dielectric layer.

As shown in FIG. 1C, with the photodetector according to the first embodiment, when incident light 18 is obliquely incident from the light incidence portion 10, it is reflected by the second principal face 16 of the semiconductor substrate 1 and is incident to the light absorption layer 5. Consequently, the incident light 18 passes through the filter layer 3 twice; once before being incident to the semiconductor substrate 1 and again before being incident to the light absorption layer 5. This means that the thickness of the filter layer 3 transmitting the incident light 18 can be made substantially double.

Next, the photodetector according to the first embodiment of the present invention in which incident light passes through the filter layer twice will be described in further detail in a comparison to a conventional photodetector in which incident light passes through the filter layer a single time.

When signal light with different short and long wavelengths is incident, the signal light on the short wavelength side is absorbed by the filter layer before it arrives at the light absorption layer. The amount of this signal light of the short wavelength side that is absorbed by the filter layer can be given by the formula $1-\exp(-\acute{a}d)$, where d is the thickness of the filter layer and $\acute{a}$ is the absorption coefficient with respect to the signal light of the short wavelength side.

For example, if a sensitivity ratio of 20 dB is to be obtained with a conventional photodetector, the amount of absorption at the filter layer should be made 99%, and taking the absorption coefficient a at 1 $\mu m^{-1}$ and substituting these values into the above formula to find the thickness d of the filter layer, it is clear that the thickness d of the filter layer needs to be approximately 4.6 $\mu$m.

With the photodetector according to the first embodiment of the present invention, however, incident light passes through the filter layer 3 twice, so that if the filter layer 3 has a thickness of 2.3 $\mu$m, the incident light 18 passes through a filter layer that is approximately double 2.3 $\mu$m, or 4.6 $\mu$m thick, and a 20 dB sensitivity ratio for 1.55 $\mu$m wavelength signal light and 1.3 $\mu$m wavelength signal light can be obtained. Consequently, the InGaAsP does not have to be epitaxially grown thicker than is necessary, so that fluctuations in the composition of the InGaAsP can be eliminated.

Also, the carrier blocking layer 4 of a material with a larger forbidden bandwidth than that of the filter layer 3 is interposed between the filter layer 3 and the light absorption layer 5, so that there is no drop in the sensitivity ratio due to the flow of carriers generated at the filter layer 3 into the light absorption layer 5.

The filtering function of the filter layer 3 and the carrier blocking function of the carrier blocking layer 4 will be described.

First the filter layer 3 will be described. The InGaAsP constituting the filter layer 3 has a different absorption edge wavelength depending on its composition. Thus, changing its composition permits the selection of wavelengths of light that are desirable or not desirable for the filter layer 3 to transmit. This means that the filter layer 3 made of InGaAsP can function as a filter.

InGaAsP is expressed as $In_{1-x}Ga_xAs_yP_{1-y}$, where the relationship between x and y is y=2.12x. This means that for the composition of $In_{1-x}Ga_xAs_yP_{1-y}$, there is a one-dimensional degree of freedom, where defining the value of x or y in the composition determines uniquely InGaAsP with a specific absorption edge wavelength. In other words, the composition of the InGaAsP can also be expressed by the absorption edge wavelength of the InGaAsP.

Figure 2:
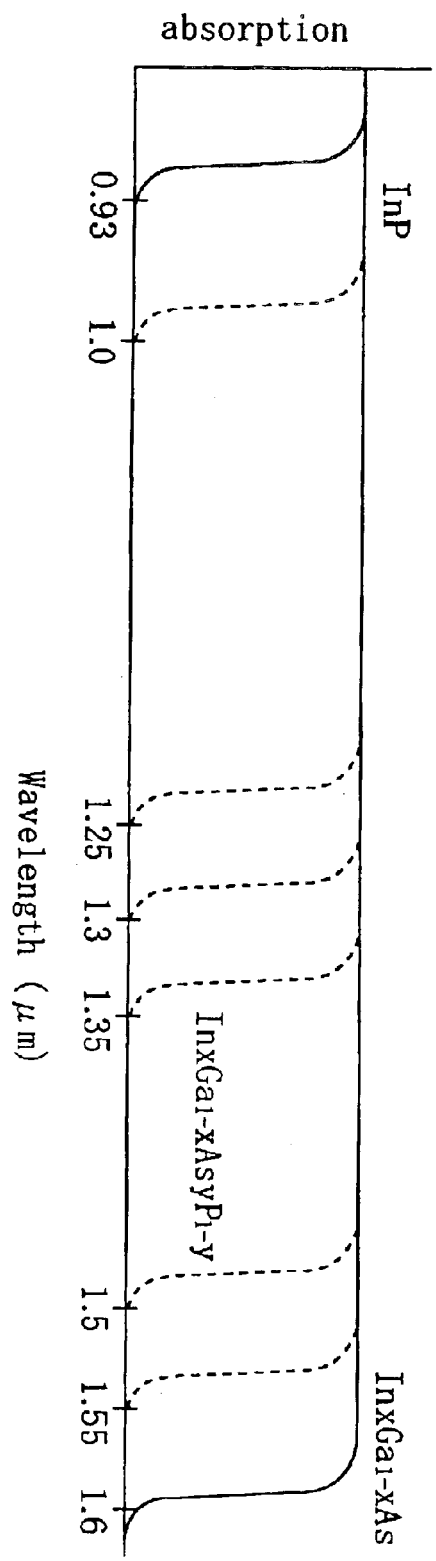
FIG. 2 is a graph showing the relationship between wavelength and InGaAsP absorption.

FIG. 2 is a graph showing the relationship between wavelength and the light absorbance of the InGaAsP. In the present specification, the maximum wavelength at which light is absorbed by the $In_{1-x}Ga_xAs_yP_{1-y}$ ($0 \leq x \leq 1$, $0 \leq y \leq 1$) is defined as the absorption edge wavelength. As shown in FIG. 2, in the case of InP where Ga and As are not included (x=0, y=0), the absorption edge wavelength is 0.93 μm, which is the smallest absorption edge wavelength among InGaAsP-based materials. On the other hand, with $In_{1-x}Ga_xAs$ in which P has not been included (y=1), the absorption edge wavelength is greater than 1.6 μm and is the largest absorption edge wavelength of InGaAsP-based materials. By taking into consideration the composition of x and y, the absorption edge wavelength of InGaAsP-based materials can be set to any value within these upper and lower ends.

Table 1 below shows the relationship between the absorption edge wavelength λg and the composition x and y of $In_{1-x}Ga_xAs_yP_{1-y}$. For reference, the forbidden bandwidth Eg is also shown.

TABLE 1

| Absorption edge wavelength λg (μm) | Forbidden bandwidth Eg (eV) | Composition x | Composition y | Remarks |
|---|---|---|---|---|
| 0.92 | 1.35 | 0.00 | 0.00 | InP |
| 1.00 | 1.24 | 0.07 | 0.16 | |
| 1.25 | 0.99 | 0.26 | 0.55 | |
| 1.30 | 0.95 | 0.29 | 0.61 | $In_{0.71}Ga_{0.29}As_{0.61}P_{0.39}$ |
| 1.35 | 0.92 | 0.32 | 0.68 | |
| 1.50 | 0.83 | 0.40 | 0.85 | |
| 1.55 | 0.80 | 0.42 | 0.90 | |
| 1.65 | 0.75 | 0.47 | 1.00 | $In_{0.53}Ga_{0.47}As$ |

In this way, by determining the value for the composition of x and y, it is possible to attain an InGaAsP layer with an absorption edge wavelength of, for example, 1.0 μm, 1.30 μm, or 1.5 μm.

Figure 3:
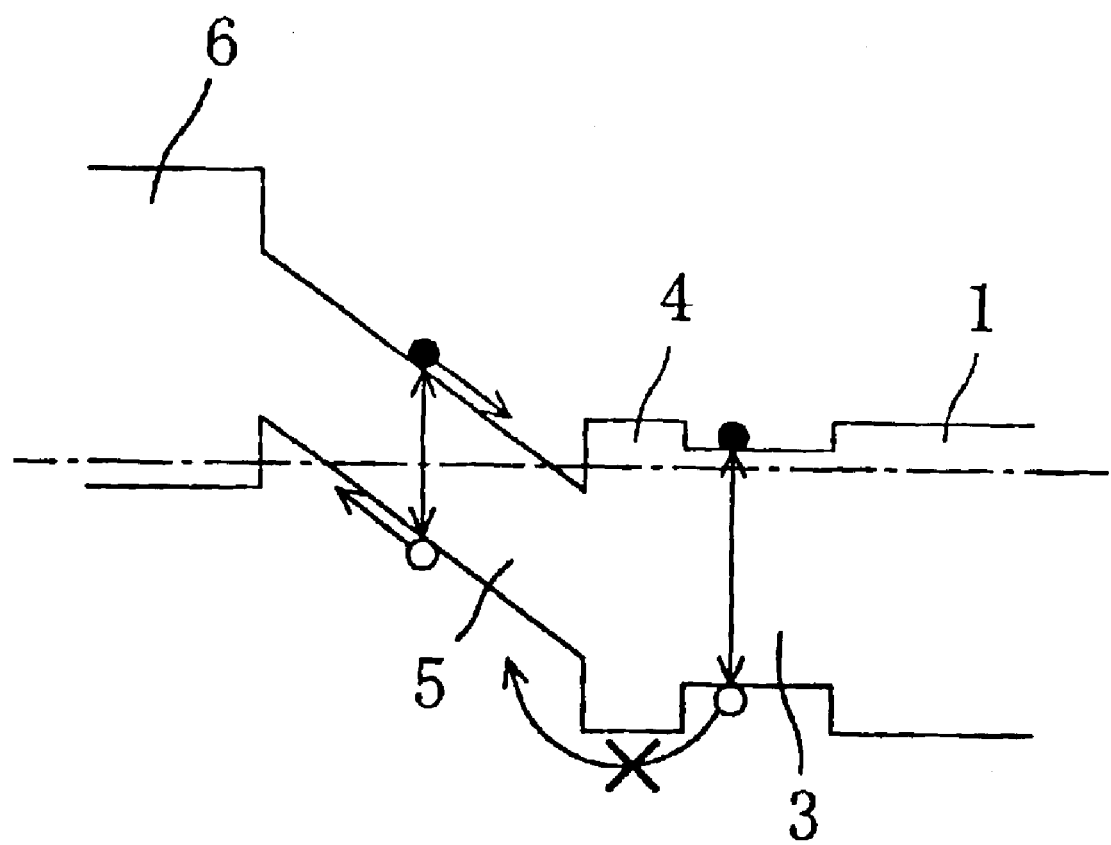
FIG. 3 is a graph showing the band gap of each layer.

The carrier blocking layer 4 will be described next. The carrier blocking layer 4 positioned between the filter layer 3 and the light absorption layer 5 has the function of preventing carriers generated at the filter layer 3 from diffusing into the light absorption layer 5. Consequently, the carrier blocking layer 4 enables the prevention of the holes of electron-hole pairs optically excited at the filter layer 3 from diffusing into the light absorption layer 5. FIG. 3 schematically shows the band gap of each layer (1, 3, 4, 5, and 6) of the photodetector of this embodiment, and black circles represent electrons and white circles represent holes.

In the case of the photodetector of this embodiment, light is reflected by the second principal face 16 of the semiconductor substrate 1 and is incident to the light absorption layer 5, so that unlike the front-incidence conventional examples, the incident light arrives at the filter layer 3 before the light absorption layer 5. The InP constituting the semiconductor substrate 1 has a relatively large band gap, and thus transmits light of a 1.3 μm or 1.55 μm wavelength for optical fiber communications (see FIG. 2 and Table 1), but in the filter layer 3 with a smaller band gap than the InP substrate 1, there is the potential for incident light to cause optical excitement and generate electron-hole pairs. To prevent the holes of the electron-hole pairs from diffusing into the light absorption layer 5, an InP carrier blocking layer 4 with a larger band gap than that of the filter layer 3 is interposed between the filter layer 3 and the light absorption layer 5. With this structure, the holes of the electron-hole pairs generated at the filter layer 3 recombine within the filter layer 3 as they were without diffusing into the light absorption layer 5, and therefore photoelectric current is not generated.

In the case of front-illumination such as in the conventional example, the wide band gap layer 6 is able to accomplish its function as a window layer, but in the case of this embodiment, in which light is reflected by the second principal face 16 of the semiconductor substrate 1 and made incident to the light absorbing layer 5, the wide band gap layer 6 acts not as a window layer but instead exclusively performs the role of reducing the reverse leak current of the p-n junction. More specifically, it is known that if in an InGaAs/InP PIN photodiode, the p-n junction is exposed to the surface of the InGaAs layer, which is the light absorption layer 5, there is an increase in leak current. If an InP wide band gap layer 6 is provided on the InGaAs layer 5, however, the p-n junction is exposed to the surface of the wide band gap layer 6 and is not exposed to the surface of the InGaAs layer 5, so that compared to the case where there is no wide band gap layer 6, a reduction in leak current can be achieved.

With the structure of this embodiment, the incident light 18 is not directly incident to the light absorption layer 5 formed on the first principal face 2 side of the semiconductor substrate 1. However, the light incidence portion 10 is on the first principal face 2 side, so that the photodetector of this embodiment is a front-incidence type photodetector. Also, the photodetector of this embodiment is a planar type photodetector in which the light-receiving portion is formed through impurity diffusion by laminating the wide band gap layer 6 on the light absorption layer 5, and because the filter layer 3 is between the light absorption layer 5 and the semiconductor substrate 1, the depth of impurity diffusion is equivalent to that of conventional planar PIN photodiodes. Consequently, the impurities do not diffuse deeply and the sensitivity ratio can be increased. Moreover, flip-chip bonding can be easily performed because the p-side electrode and the n-side electrode are both formed on the first primary surface 2 side of the semiconductor substrate 1. Additionally, the top of the wide band gap layer 6, in which impurities are not diffused, is covered with the insulating film 13, so that tail current generated by the incident light 18 being incident to the light absorption layer 5 other than below the diffusion layer 7 can be suppressed.

It should be noted that in the photodetector according to the first embodiment, the reason for depositing the antireflective film 11 to the inner side of the p-side electrode 9 is that light incident when light is directly illuminated from above the light absorption layer 5 during, inspection is not reflected. However, depending on the structure of the unit mounted with a photodetector, the sensitivity ratio may be deteriorated by the scattered light of the incident light 18 being incident from above the light absorption layer 5. In this case, it is desirable that the p-side electrode 9 be circular instead of ring-shaped so that light incident from above the light absorption layer is shielded out. Moreover, in the photodetector according to the first embodiment, the n-side electrode 8 and the pad 14 are formed on the carrier blocking layer 4, but they can also be formed on the filter layer 3 or the semiconductor substrate 1. This is because it is often the case that the filter layer 3 has a smaller forbidden bandwidth than that of the carrier blocking layer 4 and the semiconductor substrate 1 has a higher carrier concentration than that of the carrier blocking layer 4, so that forming the n-side electrode on them may be able to reduce the contact resistance. Additionally, when performing flip-chip bonding, it is best that the n-side electrode 8 and the pad 14 are of equal height, so that it is referable that the pad 14 is formed on the same semiconductor layer as the n-side electrode 8.

Other conditions of the photodetector of this embodiment are illustratively shown below. It should be noted that the present invention is not limited by these conditions, which can be suitably set as appropriate.

The thickness of the semiconductor substrate (InP substrate) 1 is about 150 to 200 μm. The height of the: island-shaped structure (light-receiving portion mesa) made up of the wide band gap layer 6, including the impurity diffusion region 7, and the light absorption layer 5 is about 2.5 to 5 μm. In the present specification, the term "island-shaped" means the shape made by a certain fixed region surrounded by a planar region, and means the shape of the convex island structure shown in FIG. 1. It also, however, includes the shape of a partially or totally buried structure.

The filter layer 3 is about 2 to 3 μm thick, and the carrier blocking layer 4 is about 1 to 2 μm thick. The light absorption layer 5 is about 1.5 to 3 μm thick, and its mesa shape is circular with a diameter of 100 to 140 μm. The thickness of the wide band gap layer 6 is 1 to 2 μm, and the mesa shape is circular with a diameter of 100 to 140 μm. The diffusion region 7 in the wide band layer 6 is circular with a diameter of 80 to 120 μm. The thickness of the reflective film 17 is about 0.2 to 0.4 μm. Each of these shapes is the shape seen from the normal of the substrate (above the photodetector).

To show the relationship of carrier concentration, the carrier blocking layer 4 (or the filter layer 3) ($n^+$ layer) has a high carrier concentration, whereas the light absorption layer 5 ($n^-$ or i layer) has a low carrier concentration. In this embodiment, the wide band gap layer 6 is made of the low carrier concentration layer ($n^-$ layer), but there are no particular limitations regarding the carrier concentration of the wide band gap layer 6.

Second Embodiment

Figure 4A:
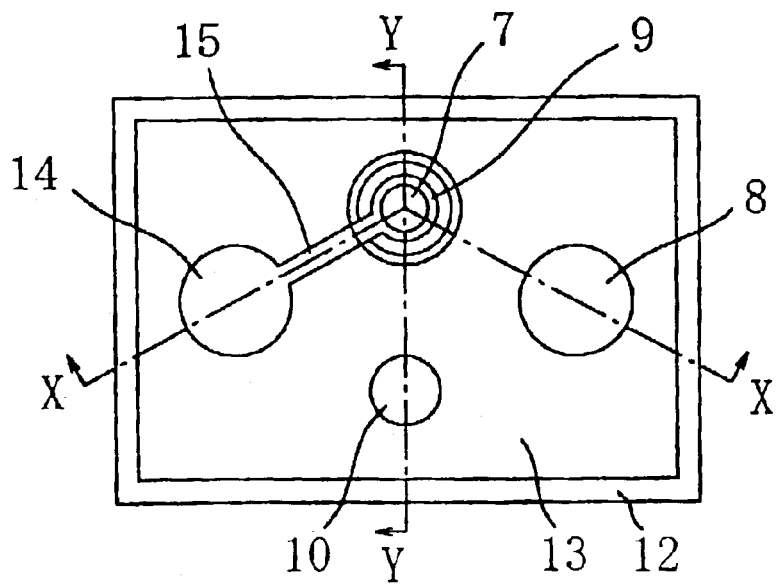
FIG. 4A is a plan view of a photodetector according to a second embodiment of the present invention.
Figure 4B:
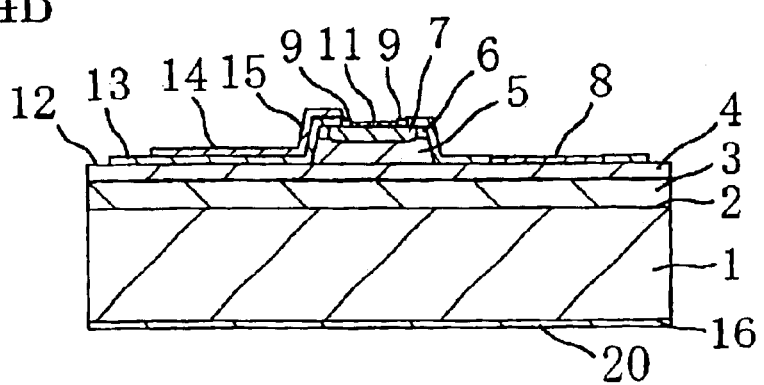
FIG. 4B is a cross-sectional view taken along the X—X line in FIG. 4A.
Figure 4C:
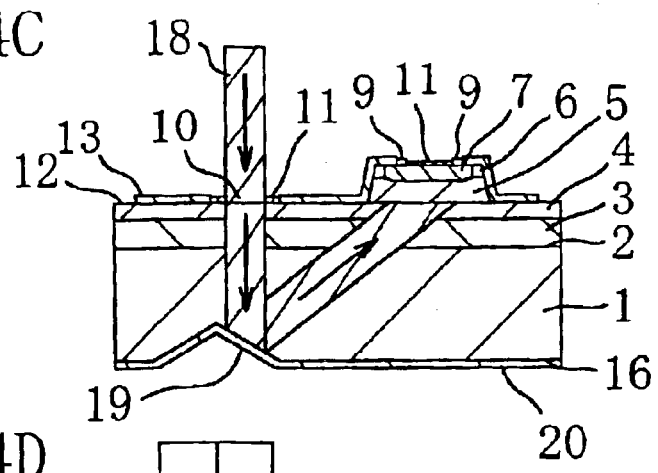
FIG. 4C is a cross-sectional view taken along the Y—Y line in FIG. 4A.
Figure 4D:
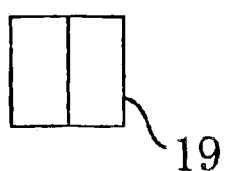
FIG. 4D is a rear face view showing a portion of the photodetector of the second embodiment.

The photodetector according to a second embodiment of the present invention will be described with reference to FIG. 4. FIG. 4A is a plan view of the photodetector according to the second embodiment, FIG. 4B is a cross-sectional view taken along the X—X line in FIG. 4A, and FIG. 4C is a cross-sectional view taken along the Y—Y line in FIG. 4A. FIG. 4D is a rear face view showing the shape of the spot of a sloped portion 19 when the semiconductor substrate 1 is viewed from its rear face.

As shown in FIG. 4C, the feature where the photodetector according to the second embodiment differs from the photodetector according to the first embodiment is that an indented portion with the sloped portion 19 is formed in the second principal face 16 of the semiconductor substrate 1, and a reflective film 20 is formed on the second principal face 16 of the semiconductor substrate 1 having the sloped portion 19. It should be noted that the incident light 18 is incident to the sloped portion 19, so that it is possible for the reflective film 20 to be formed on only the sloped portion 19. Also, the sloped portion 19 is located opposite the light incidence portion 10, and the degree it is sloped with respect to the semiconductor substrate 1 is set such that the incident light 18 is reflected by the sloped portion 19 and made incident to the light absorption layer 5. The angle of the slope can be suitably set to an appropriate value within the range of 15 to 35 degrees, for example. If the sloped portion 19 is formed by exposing a specific crystal plane, the angle of the slope can be set with high precision and ease.

For the sake of simplifying the description, components similar to those in the photodetector of the first embodiment bear the same numerals and their description is omitted.

With the photodetector according to the second embodiment, the incident light 18 that is incident perpendicular to the first principal face 2 enters from the light incidence portion 10 perpendicular to the semiconductor substrate 1. Thereafter, it is reflected by the sloped portion 19 and is incident to the light absorption layer 5.

Unlike the photodetector according to the first embodiment, the photodetector according to the second embodiment can be used if perpendicular incidence is more suitable, depending on the form taken when the photodetector is mounted. In the same way as the photodetector according to the first embodiment, the photodetector according to the second embodiment transmits the incident light 18 through the filter layer 3 twice, and therefore it obviously has the effect of transmitting the incident light 18 through the filter layer that is substantially double in thickness.

Third Embodiment

Figure 5A:
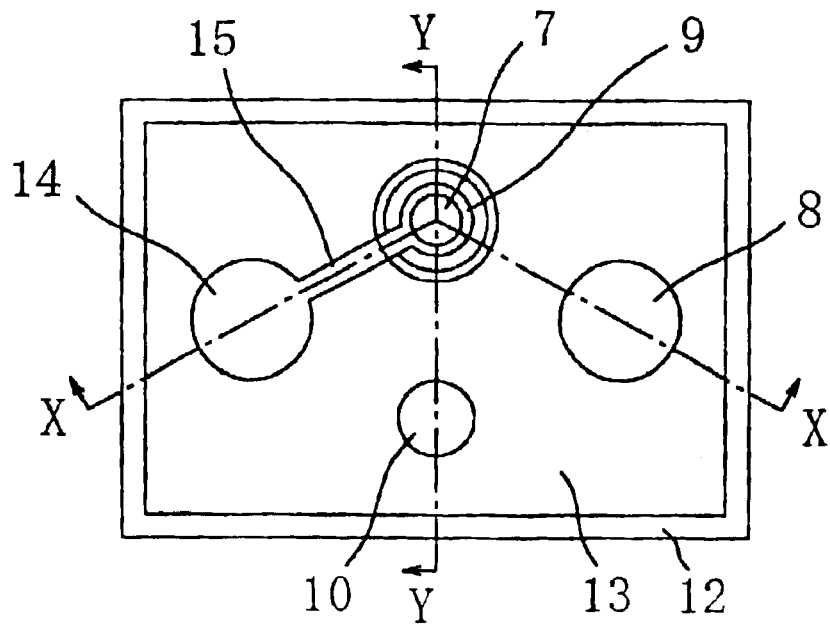
FIG. 5A is a plan view of a photodetector according to a third embodiment of the present invention.
Figure 5B:
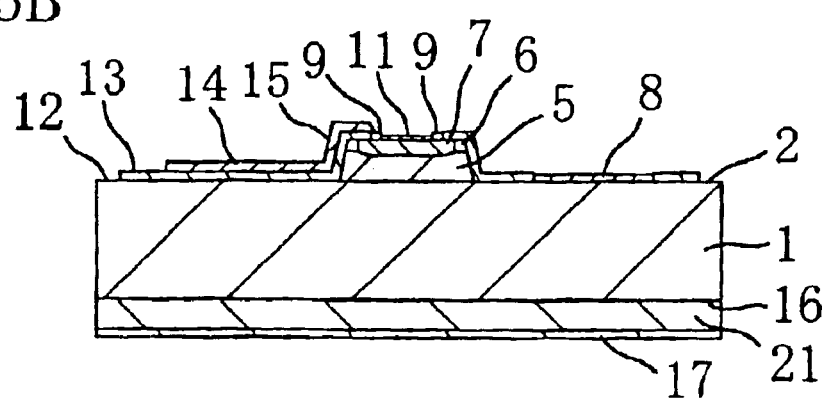
FIG. 5B is a cross-sectional view taken along the X—X line in FIG. 5A.

The photodetector according to a third embodiment of the present invention will be described with reference to FIG. 5. FIG. 5A is a plan view of the photodetector according to the third embodiment, FIG. 5B is a cross-sectional view taken along the X—X line in FIG. 5A, and FIG. 5C is a cross-sectional view taken along the Y—Y line in FIG. 5A.

Figure 5C:
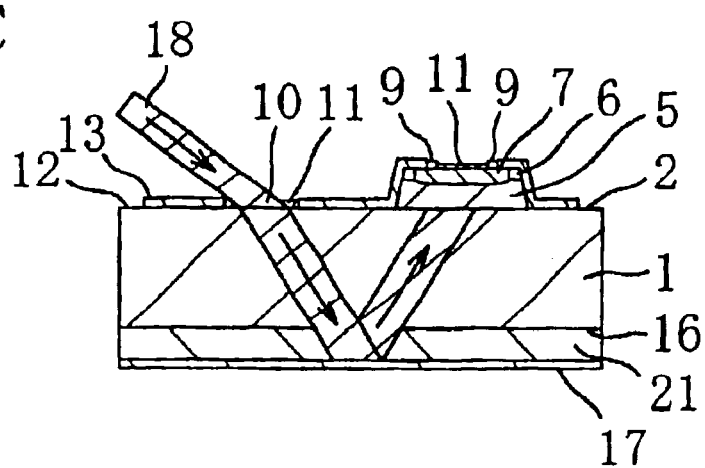
FIG. 5C is a cross-sectional view taken along the Y—Y line in FIG. 5A.

As shown in FIG. 5C, the feature where the photodetector according to the third embodiment differs from the photodetector according to the first embodiment is that the filter layer 3 is not formed on the first principal face 2 of the semiconductor substrate 1 and instead a filter layer 21 is formed on the second principal face 16 of the semiconductor substrate 1, and the reflective film 17 is formed on the filter layer 21. Also, another feature is that the carrier blocking layer is not formed.

For the sake of simplifying the description, the same components as those of the photodetector of the first embodiment bear the same numerals and their description is omitted.

Like the photodetector according to the first embodiment, in the photodetector according to the third embodiment, the incident light 18 passes through the filter layer 21 twice, before and after being reflected at the second principal face 16 of the semiconductor substrate 1. This means that the thickness of the filter layer 21 through which the incident light 18 passes can be made substantially double.

The incident light 18 is incident from the light incidence portion 10 formed on the first principal face 2 side of the semiconductor substrate 1, so that the photodetector according to the third embodiment is a front-incidence type photodetector. Furthermore, since the filter layer 21 is on the second principal face 16 of the semiconductor substrate 1, the photodetector according to the third embodiment can also readily be made into a planar PIN photodiode in which the light-receiving portion is formed through impurity diffusion by laminating the wide band gap layer 6 on the light absorption layer 5, and the depth of impurity diffusion is equivalent to that of conventional PIN photodiodes. Moreover, the semiconductor substrate 1 itself serves the role of protecting carriers generated at the filter layer 21 from flowing into the light absorption layer 5, so that it is not particularly necessary that a carrier blocking layer be provided.

It is also possible to combine the photodetector according to the third embodiment and the photodetector according to the first embodiment, that is, for a filter layer to be formed on both the first principal face 2 and the second principal face 16 of the semiconductor substrate 1. With this structure, the upper and lower filter layers are each passed through twice so that incident light passes through a filter layer four times, and therefore the thickness of the filter layer can be made substantially four times greater, and a sensitivity ratio that is substantially four times greater can be obtained. As described above, fluctuations in the composition of the InGaAsP layer serving as the filter layer occur easily if it is epitaxially grown thickly, but if formed on the first principal face 2 and the second principal face 16 of the semiconductor substrate 1, the filter layers can easily be formed at a thickness of 2.3 μm each. In this case, the incident light passes through a filter layer which is approximately 9.2 μm thick, and an approximately 40 dB sensitivity ratio can be achieved for signal light of a 1.55 μm wavelength and signal light of a 1.3 μm wavelength.

Fourth Embodiment

Figure 6A:
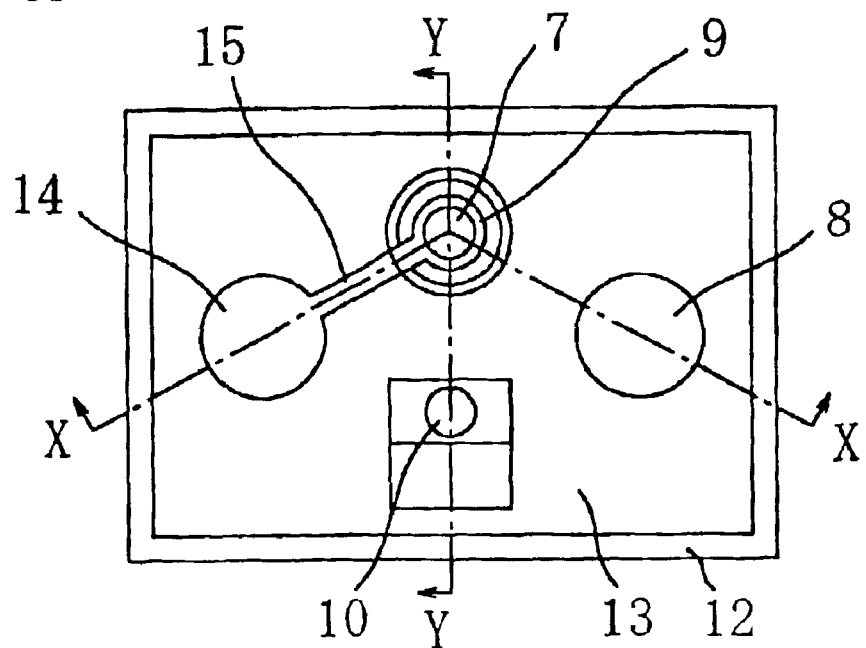
FIG. 6A is a plan view of a photodetector according to a fourth embodiment of the present invention.
Figure 6B:
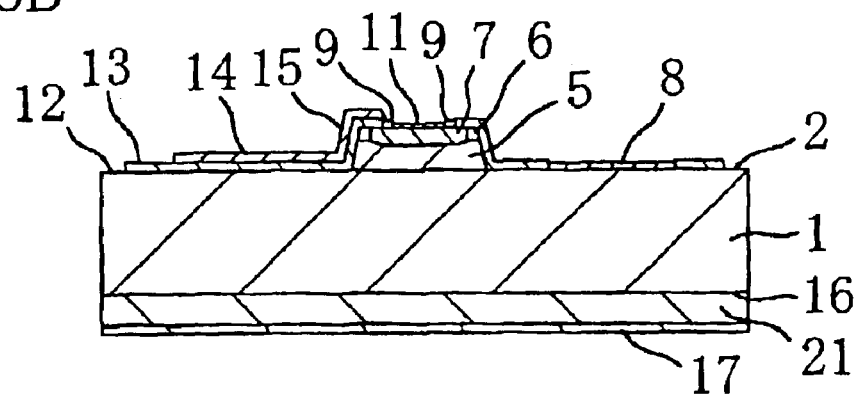
FIG. 6B is a cross-sectional view taken along the X—X line in FIG. 6A.

The photodetector according to a fourth embodiment of the present invention will be described with reference to FIG. 6. FIG. 6A is a plan view of the photodetector according to the fourth embodiment, FIG. 6B is a cross-sectional view taken along the X—X line in FIG. 6A, and FIG. 6C is a cross-sectional view taken along the Y—Y line in FIG. 6A.

Figure 6C:
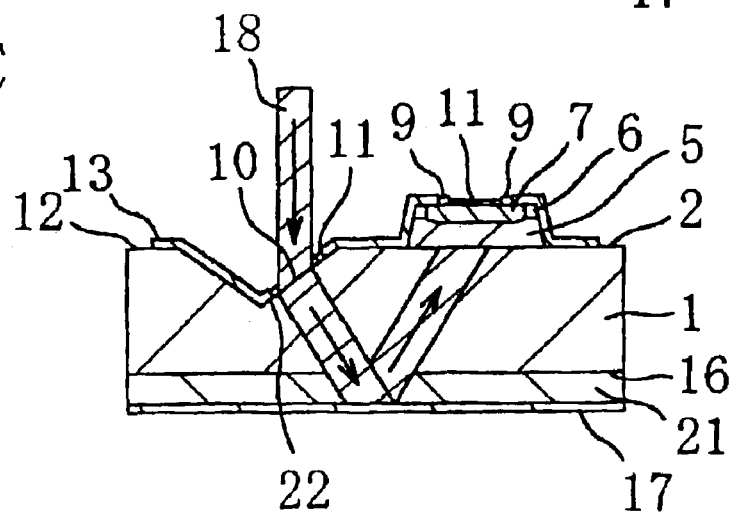
FIG. 6C is a cross-sectional view taken along the Y—Y line in FIG. 6A.

As shown in FIG. 6C, the photodetector according to the fourth embodiment is different from the photodetector according to the third embodiment in the feature of a concave portion with a sloped portion 22 being formed in the first principal face 2 of the semiconductor substrate 1.

For the sake of simplifying the description, the same components as those of the photodetector of the third embodiment bear the same numerals and their description is omitted.

The light incidence portion 10 is formed in the sloped portion 22, and the incident light 18 that is incident from the light incidence portion 10 is refracted at the sloped portion 22 and then enters the semiconductor substrate 1. Thereafter, it is reflected by the second principal face 16 and becomes incident to the light absorption layer 5. A photodetector with a structure in which there is no sloped portion 22 and the first principal face 2 and the second principal face 16 are parallel, as is the case with the photodetector according to the third embodiment, the incident light 18 should be obliquely incident so that the light can be let incident to the light absorption layer 5. However, if like in the photodetector according to the fourth embodiment, the sloped portion 22 is formed in the second principal face 16 and the incident light 18 is refracted by the sloped portion 22, then the incident light 18 that enters perpendicular to the first principal face 2 can be let incident to the light absorption layer 5. It should be noted that like the photodetector according to the third embodiment, in the photodetector according to the fourth embodiment, the incident light 18 passes through the filter layer 21 twice, and thus it goes without saying that there is the effect of the incident light passing through a filter layer of a thickness that is substantially double.

Fifth Embodiment

The photodetector according to a fifth embodiment of the present invention will be described with reference to FIG. 7. FIG. 7A is a plan view of the photodetector according to the fifth embodiment, FIG. 7B is a cross-sectional view taken along the X—X line in FIG. 7A, and FIG. 7C is a cross-sectional view taken along the Y—Y line in FIG. 7A. FIG. 7D is a rear face drawing showing the shape of the spot of the sloped portion 19 when seen from the rear face of the semiconductor substrate 1.

As shown in FIG. 7C, the photodetector according to the fifth embodiment differs from the photodetector according to the first embodiment in the feature that a light incidence portion 23 is formed on the second principal face 16 of the semiconductor substrate 1 and a second reflective film 24 is formed on the carrier blocking layer 4 on the first principal face 2. It should be noted that the reflective layer 17 is not formed on the second principal face 2 at the portion where the light incidence portion 23 is formed.

For the sake of simplifying the description, the same components as those of the photodetector of the first embodiment bear the same numerals and are not described further.

With the photodetector according to the fifth embodiment, incident light that is incident from the light incidence portion 23 formed on the second principal face 16 is reflected by the reflective film 24 on the first principal face 2, and after being further reflected by the reflective film 17 on the second principal face 16, it is incident to the light absorption layer 5. The outcome of this arrangement is that the incident light 18 passes through the filter layer 3 three times before arriving at the light absorption layer 5. If the filter layer 3 has a thickness of, for example, 2.3 μm, the incident light 18 passes through a filter layer that is 6.9 μm thick, and a sensitivity ratio of 30 dB can be obtained for 1.55 μm wavelength signal light and 1.3 μm wavelength signal light. This structure is effective particularly if it is preferable that the photodetector is of a rear-incidence type, and enables the filter layer 3 through which the incident light 18 passes to have a thickness that is substantially three times greater.

A photodetector with a structure in which the filter layer is passed through five or 2n+1 (where n is a natural number of 2 or more) times can be achieved by increasing the distance between the light incidence portion 23 and the light absorption layer 5 and increasing the size of reflective film 24 or providing a plurality of reflective films 24. Also, a photodetector with a structure in which the incident light 18 passes through the filter layer four or 2n (where n is a natural number of 2 or more) times before arriving at the light absorption layer 5 can be achieved by allowing a front-incidence type photodetector to have a structure in which the light incidence portion 24 is formed on the first principal face 2 side of the semiconductor substrate 1.

Sixth Embodiment

Figure 8A:
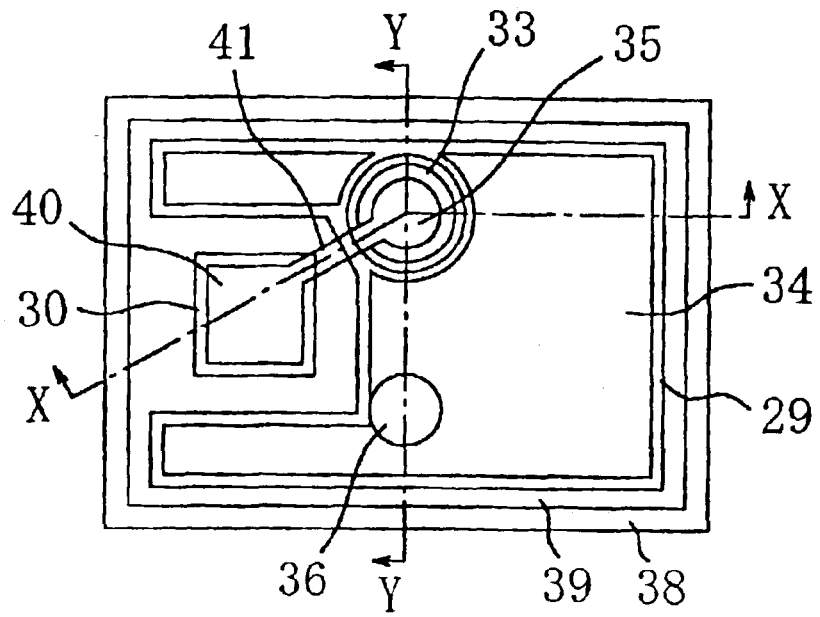
FIG. 8A is a plan view of a photodetector according to a sixth embodiment of the present invention.

The photodetector according to a sixth embodiment of the present invention will be described with reference to FIG. 8. FIG. 8A is a plan view of the photodetector according to the sixth embodiment, FIG. 8B is a cross-sectional view taken along the X—X line in FIG. 8A, and FIG. 8C is a cross-sectional view taken along the Y—Y line in FIG. 8A.

Figure 8B:
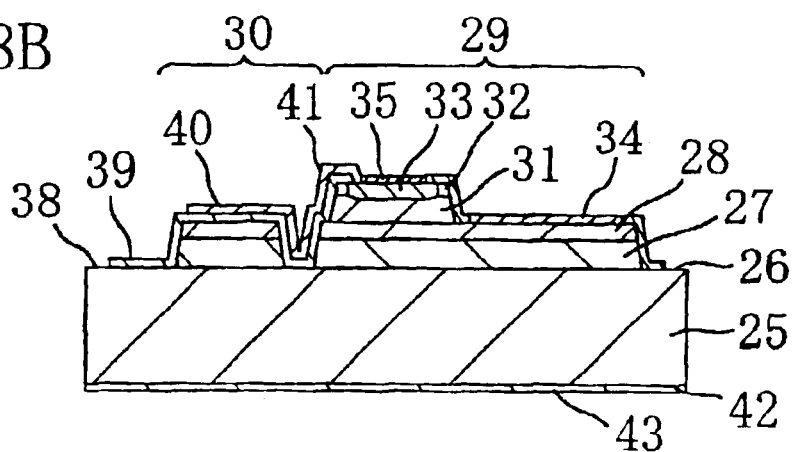
FIG. 8B is a cross-sectional view taken along the X—X line in FIG. 8A.

As shown in FIG. 8B, two islands, a first mesa 29 and a second mesa 30, are formed on a first principal face 26 of a semiconductor substrate 25 made of a semi-insulating InP. For these islands a filter layer 27 made of n-type InGaAsP with a 1.4 μm absorption edge wavelength and a carrier blocking layer 28 made of n-type InP have been laminated. On the first mesa 29 are laminated an island-shaped light absorption layer 31 made of low-concentration n-type InGaAs and a wide band gap layer 32 made of low-concentration n-type InP. In the center area of the wide band gap layer 32 is a diffusion region 33 in which p-type impurities such as Zn have been diffused. An n-side electrode 34 and a p-side electrode 35 are formed on the carrier blocking layer 28 of the first mesa 29 and the diffusion region 33, respectively. The n-side electrode 34 is formed such that it occupies the top of the first mesa 29.

Figure 8C:
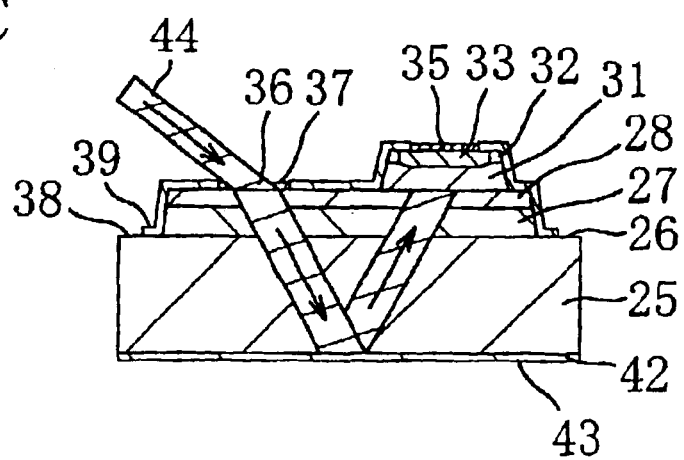
FIG. 8C is a cross-sectional view taken along the Y—Y line in FIG. 8A.

Also, as shown in FIGS. 8A and 8C, in the first mesa 29 a light incidence portion 36 is formed on the carrier blocking layer 28 away from the light absorption layer 31, and to the inner side of the light incidence portion 36 is deposited an antireflective film 37 made of SiN.

Furthermore, as shown in FIGS. 8A and 8B, the exposed front surface of the semiconductor layer, except for a scribe lane 38 at the periphery, is covered with an insulating film 39 of laminated SiN and $SiO_2$, and a pad 40 formed over the second mesa 30 via the insulating film 39 is connected to the p-side electrode 35 by wiring 41. The n-side electrode 34, the p-side electrode 35, the pad 40, and the wiring 41 are made of a laminated metal film of Ti/Pt/Au, for example, and can be formed collectively by a single vapor deposition and lift-off process.

A reflective film 43 for reflecting light is formed on a second principal face 42 of the semiconductor substrate 25. The reflective film 43 can be made of only a metal film, but a higher reflectance can be attained if it has a laminated structure of a dielectric and a metal, such as SiN and Al.

Like the photodetector according to the first embodiment, in the photodetector according to the sixth embodiment, incident light 44 passes through the filter layer 27 twice, once before it enters the substrate 25 and once before it is incident to the light absorption layer 31. This means that the thickness of the filter layer 27 that transmits the incident light 44 can be taken as a thickness that is substantially double. Also, since the carrier blocking layer 28, which is made of a material with a larger forbidden bandwidth than that of the filter layer 27, is interposed between the filter layer 27 and the light absorption layer 31, there are no drops in the sensitivity ratio due to carriers generated at the filter layer 27 flowing into the light absorption layer 31.

Although the incident light 44 is not directly incident to the light absorption layer 31 formed on the first principal face 26 side of the semiconductor substrate 25, because the light incidence portion 36 is on the first principal face 26 side, the photodetector according to the sixth embodiment is a front-incidence type photodetector. It is also a planar-type photodetector, in which the light-receiving portion is formed by impurity diffusion by laminating the wide band gap layer 32 on the light absorption layer 31, and since the filter layer 27 is between the light absorption layer 31 and the semiconductor substrate 25, the depth of impurity diffusion is equivalent to that of the photodetector according to the first embodiment. Furthermore, both the p-side and n-side electrodes are formed on the first principal face 26 side of the semiconductor substrate 25, and therefore flip-chip bonding can be easily performed.

The above effects are the same as those of the photodetector of the first embodiment, but in the photodetector according to the sixth embodiment, the portion of the pad 40 of the p-side electrode 35 and the portion of the light absorption layer 31 are separated into mesa-shapes (islands) using the semi-insulating semiconductor substrate 25. If they are not separated, the pad of the p-side electrode would be formed via the insulating film using an n-type substrate, which would result in a MIS (metal insulator semiconductor) structure and the pad capacitance being added to the element capacitance, and that pad capacitance may have an impact on the overall photodetector. By contrast, with the photodetector according to the sixth embodiment, the pad 40 is formed on a mesa (second mesa 30) separate from the n-type layer (first mesa 29) on which n-side electrode 34 is formed, and has the unique effect that the pad capacitance is not added to the element capacitance.

In the photodetector according to the sixth embodiment, lo a circular not ring-shaped p-side electrode 35 is used to block light incident from above the light absorption layer 31. This is to prevent scattered light of the incident light 44 from entering from above the light absorption layer 31 and deteriorating the sensitivity ratio. However, the p-side electrode 35 can also be made ring-shaped if during inspection incident light is to be directly incident from above the light absorption layer 31. Also, in the photodetector according to the sixth embodiment, the n-side electrode 34 is formed on the carrier blocking layer 28, but it may also be formed on the filter layer 27. The filter layer 27 has a smaller forbidden bandwidth than that of the carrier blocking layer 28, and forming the n-side electrode on the filter layer 27 may lead to a reduction in contact resistance. Additionally, the pad 40 can be formed on a second mesa 30 made of only the filter layer 27, or it can be formed on the semiconductor substrate 25. However, in either case it is preferably done so via the insulating film 39. This is because even a semi-insulating substrate is somewhat conductive, and forming the pad 40 directly on the semiconductor layer causes leak current between it and the n-side electrode.

Seventh Embodiment

Figure 9:
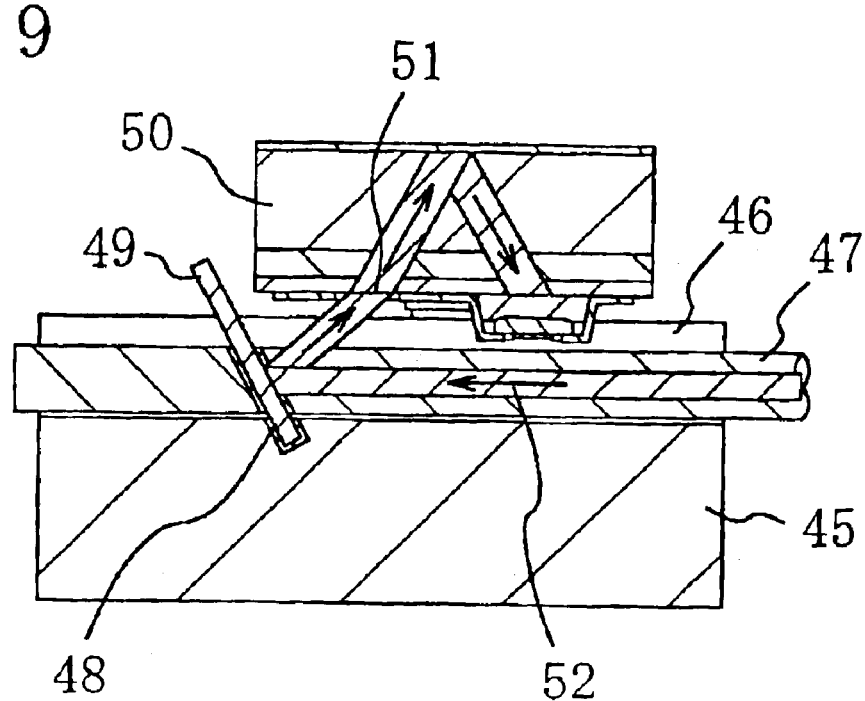
FIG. 9 is a cross-sectional view of a unit mounted with photodetector according to a seventh embodiment of the present invention.
Figure 10:
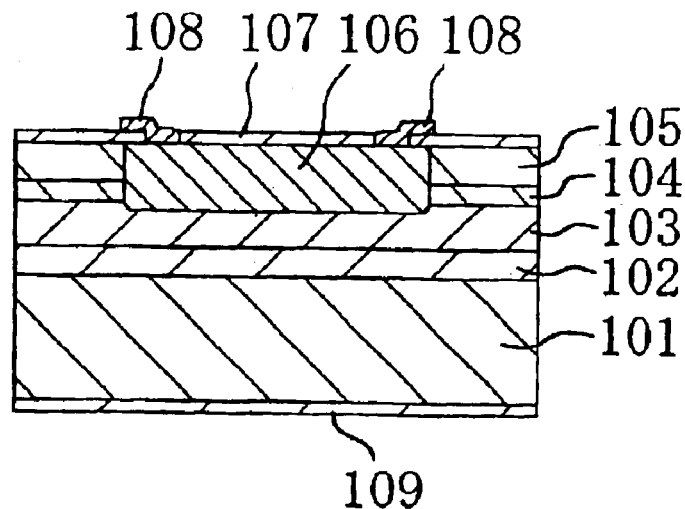
FIG. 10 is a cross-sectional view of a conventional PIN photodiode with long wavelength passband properties.

With reference to FIG. 9, a seventh embodiment describes a unit mounted with photodetector in which the photodetector according to the first embodiment of the present invention and the optical component are electrically or optically mounted. Here, FIG. 9 is a cross-sectional view of the unit mounted with photodetector according to the seventh embodiment of the present invention.

A guide groove 46 is formed in a mounting substrate 45 made of quartz glass or a semiconductor such as Si or GaAs, and an optical fiber 47 is placed into the guide groove 46. The guide groove 46 is filled in with a resin (not shown).

A slit 48 is formed in the mounting substrate 45 so that the optical fiber 47 is severed obliquely, and a reflective plate 49 is inserted into the slit 48. Also, a photodetector 50 is flip-chip bonded to the surface of the mounting substrate 45 such that it spans the guide groove 46. The photodetector 50 has been bonded with its light incidence portion 51 facing the mounting substrate 45.

Incident light 52 propagates through the optical fiber 47 from the right in the paper plane, is reflected by the reflective plate 49, and is incident to the light incidence portion 51 of the photodetector 50. The incident light 52 that enters the photodetector 50 is reflected by the second principal face of the semiconductor substrate and is incident to the light absorption layer, as described in the first embodiment. Consequently, the incident light 52 passes through the filter layer twice, once before entering the semiconductor substrate and once before being incident to the light absorption layer. That is to say, the thickness of the filter layer through which the incident light 52 passes can be taken as substantially twice its thickness.

In the unit mounted with photodetector according to the seventh embodiment, the photodetector 50 is flip-chip bonded to the mounting substrate 45, so that compared to the case where it is wire-bonded, there is a reduction in parasitic capacitance caused by the wire and high operating speeds are possible. Particularly if the mounting substrate is a dielectric such as glass or a semi-insulating semiconductor substrate, there is an enhanced effect of reduction in parasitic capacitance. Furthermore, by using a photodetector with oblique incidence at the light incidence portion, the incident light 52 from the mounting substrate 45 side is directly incident to the light incidence portion 51 of the photodetector 50 and optically bonds, so that optical bonding is also completed at the moment the photodetector 50 has been bonded to the mounting substrate 45. Thus, a mounting process for optical bonding is unnecessary.

Although not shown, if a semiconductor laser is placed at the outgoing side of the optical fiber 47 (the left end side of the optical fiber 47 in FIG. 9) and the reflective plate 49 is a half mirror, then a light-receiving light-emitting module can be easily produced.

It is also possible for the photodetector 50 to be any of the photodetectors according to the second to sixth embodiments, but if there is to be oblique incidence at the light incidence portion 51, as shown in FIG. 9, then it is preferable that a photodetector according to the third, fifth, or sixth embodiments is used, and if there is to be perpendicular incidence at the light incidence portion 51, that is, if the reflective plate 49 is to be provided such that it is at a 45 degree angle with respect to the direction of the route of the incident light 52, then it is preferable that a photodetector according to either the second or fourth embodiment is used.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A photo detector comprising:

a semiconductor substrate;

a filter layer formed on a second principal face of the semiconductor substrate;

a light absorption layer formed in an island on a first principal face of the semiconductor substrate; and a light incidence portion formed on the first principal face at a portion where the light absorption layer has not been formed;

wherein an absorption edge wavelength of the filter layer is longer than an absorption edge wavelength of the semiconductor substrate and shorter than an absorption edge wavelength of the light absorption layer.

2. The photodetector according to claim 1, wherein a wide band gap layer having an impurity diffusion region is formed on the light absorption layer.

* * * * *